United States Patent [19]

Akiyama et al.

[11] Patent Number: 5,420,046

[45] Date of Patent: May 30, 1995

[54] METHOD FOR MANUFACTURING OPTICALLY TRIGGERED LATERAL THYRISTOR

[75] Inventors: Sigeo Akiyama; Fumio Kato; Kiyoshi Hosotani; Masato Miyamoto, all of Kadoma, Japan

[73] Assignee: Matsushita Electric Works, Ltd., Osaka, Japan

[21] Appl. No.: 339,293

[22] Filed: Nov. 10, 1994

Related U.S. Application Data

[63] Continuation of Ser. No. 20,466, Feb. 22, 1993, abandoned, which is a continuation of Ser. No. 656,947, Feb. 19, 1991, abandoned.

[30] Foreign Application Priority Data

Feb. 23, 1990 [JP] Japan .................................. 2-43331
Feb. 23, 1990 [JP] Japan .................................. 2-43332

[51] Int. Cl.[6] ........................................... H01L 49/00
[52] U.S. Cl. ................................................... 437/6
[58] Field of Search ............... 437/6, 916; 257/113, 257/114, 115, 116, 117, 118, 162, 175, 141, 142, 122

[56] References Cited

U.S. PATENT DOCUMENTS

| | | | |
|---|---|---|---|
| 3,766,446 | 11/1973 | Tarui et al. | 148/DIG. 151 |
| 3,919,007 | 11/1975 | Tarui et al. | 148/DIG. 151 |
| 4,072,975 | 2/1978 | Ishitani | 357/23 |
| 4,244,000 | 1/1981 | Ueda et al. | 357/39 |
| 4,244,634 | 9/1980 | Svedberg | 357/38 |
| 4,396,932 | 8/1983 | Alonas et al. | 357/39 |
| 4,458,408 | 7/1984 | Alonas et al. | 29/576 |
| 4,613,884 | 9/1986 | Angerstein et al. | 357/39 |
| 4,742,380 | 5/1988 | Chang et al. | 357/23.4 |
| 4,760,431 | 7/1988 | Nakagawa et al. | 357/234 |
| 4,779,126 | 10/1988 | Herman | 357/38 |
| 4,851,888 | 7/1989 | Ueno | 357/38 |
| 4,866,495 | 9/1989 | Kinzer | 357/38 |
| 4,912,541 | 3/1990 | Baliga et al. | 357/38 |

FOREIGN PATENT DOCUMENTS

| | | | |
|---|---|---|---|
| 0159883 | 12/1979 | Japan | 437/6 |
| 63-7471 | 1/1988 | Japan . | |
| 2133641 | 7/1984 | United Kingdom | 357/39 |
| 2150348 | 6/1985 | United Kingdom . | |
| 3808579 | 10/1988 | United Kingdom | 437/6 |

OTHER PUBLICATIONS

P. D. Taylor, "Thyristor Design and Realization," *Design and Measurement in Electrical and Electronic Engineering*, by John Wiley & Sons, cover sheet and pp. 62–63, 1987.

Article, "Electronics", Nikkei Electronics dated Dec. 10, 1979/p. 197 et seq.

*Primary Examiner*—Olik Chaudhuri
*Assistant Examiner*—Brian K. Dutton
*Attorney, Agent, or Firm*—Burns, Doane, Swecker & Mathis

[57] ABSTRACT

A method for manufacturing an optically triggered lateral thyristor is to form an anode region by providing a first opening in an insulating layer formed on a semiconductor substrate, a diffusion layer by providing a second opening in the insulating layer to be spaced from the anode region, a base-forming region by providing a third opening in the insulating layer externally adjacent to the second opening, and a base region and simultaneously a cathode region by means of double diffusion through the third opening, the base region having a lateral width determined by a diffusion difference between the base and cathode regions for effective minimization of the width.

1 Claim, 4 Drawing Sheets

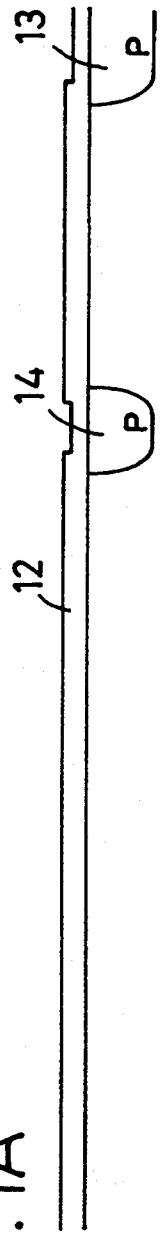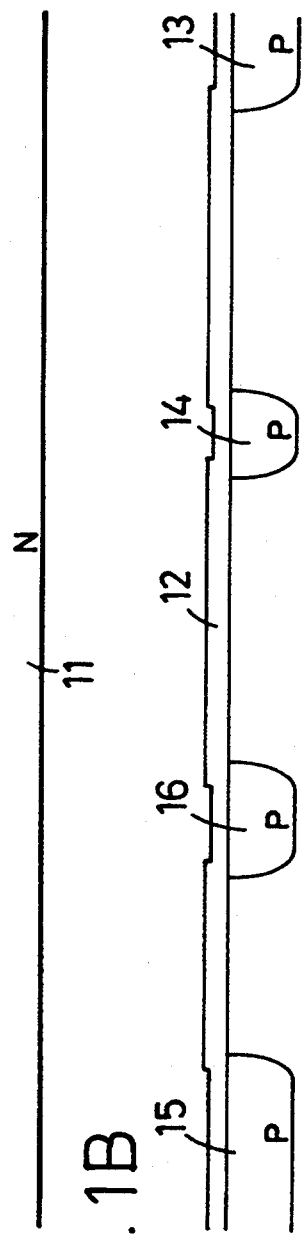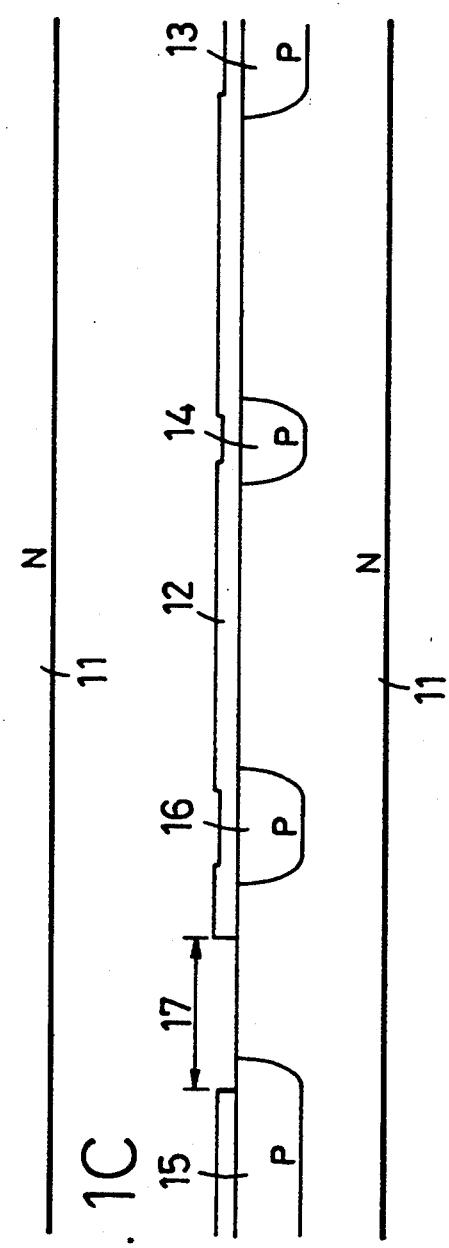

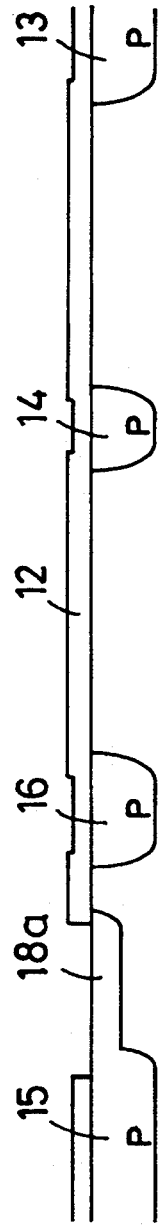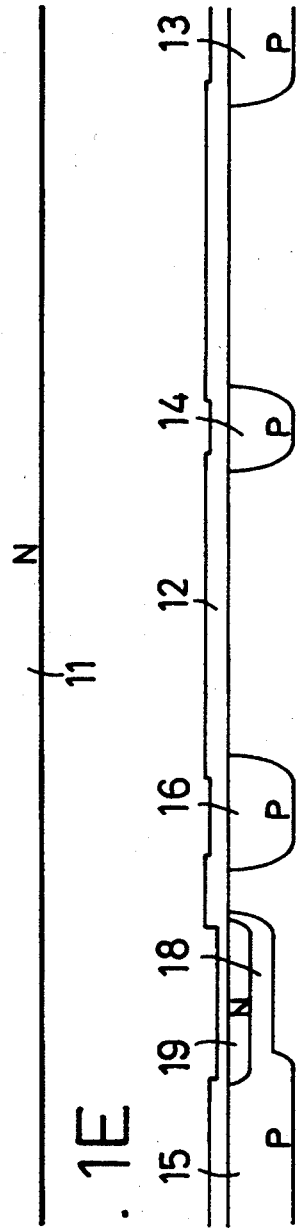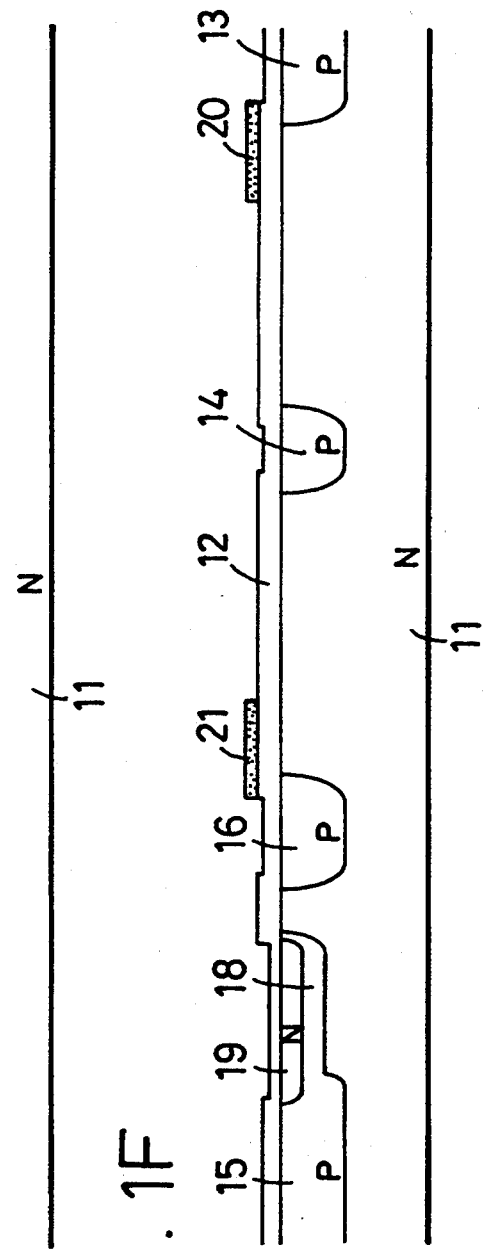

METHOD FOR MANUFACTURING OPTICALLY TRIGGERED LATERAL THYRISTOR

This application is a continuation of application Ser. No. 08/020,466, filed Feb. 22, 1993, which is a continuation of application Ser. No. 07/656,947, filed Feb. 19, 1991 both now abandoned.

BACKGROUND OF THE INVENTION

This invention relates to a method for manufacturing an optically triggered lateral thyristor, that is, the thyristor of lateral conduction type.

The lateral thyristors of the kind referred to are found to be useful when used as the optically triggered thyristor in an a.c. solid state relay.

DESCRIPTION OF RELATED ART

A basic constitution of the lateral thyristor utilized in the solid state relay has been described in, for example, U.S. Pat. No. 4,244,000 to Udea et al, the lateral thyristor of which is the one made according to planar diffusions so as to be optically triggered and to have a MOSFET in a P-type base region which is bridged with a cathode by the MOSFET. In this case, the MOSFET has a gate electrode of a potential determined by a capacity of an insulating layer below the gate electrode, a capacity of an insulating layer between the gate electrode and an electrode connected to an anode, and a resistor connected to the gate electrode. When an abruptly rising voltage is applied across the anode and cathode in this thyristor, since the MOSFET is turned to be conductive because the gate potential of the MOSFET rises so as to exceed a threshold voltage, the thyristor is prevented from being mistriggered. In this U.S. patent to Hagimura, however, the thyristor relates only to very small currents, and there has been a problem left unsolved in that the thyristor of this patent can hardly be used in the solid state relay for use with any high current, that is, in the one for power controlling.

In "Electronics" published in the United States as of Aug. 30, 1979 or U.S. Pat. Nos. 4,458,408 and 4,396,932 of P. G. Alohas et al, there has been disclosed a monolithic TRIAC driver formed by means of the planar diffusions to be provided with a zero-crossing function as well as a function of preventing a dV/dt mistriggering. In which case a MOSFET is formed within a P-type well diffusion-formed in a semiconductor substrate and a gate is connected to the substrate, so as to realize an intended function. In this TRIAC driver, however, it is required to set a gate rupture voltage to be higher than the breakdown voltage of the TRIAC so that there has been a problem that difficulties arise when the breakdown voltage is intended to be made higher or the zero-crossing voltage is intended to be lowered. When this TRIAC driver is intended to be applied to the solid state relay for the high current controlling, further, there has arisen a problem that a separate main TRIAC is called for.

In U.S. Pat. No. 4,224,634 to Per Svedberg, on the other hand, there has been disclosed a lateral thyristor prepared by means of the planar diffusions for a high current controlling, and this thyristor is made optically triggerable. In this lateral thyristor, however, it is required to provide thereto an outer signal for preventing the thyristor from being triggered and for being extinguished, and the gate circuit of the MOSFET is incomplete, so that the thyristor has been still troublesome in using as the solid state relay.

An optically triggered thyristor for use in controlling the high current as provided with the zero-crossing function and the mistrigger preventing function as well has been disclosed in Japanese Patent Publication No. 63-7471, which provides a MOSFET having a cathode and P-type base clamped for providing a vertical thyristor of PNPN four layers structure with the zero-crossing and mistriggering preventing functions. In this MOSFET, a gate electrode is connected to a P-type region formed in a part of N-type substrate adjacent to the P-type base region so that, when an applied voltage across the anode and cathode has reached a predetermined value, a space-charge region (depletion region) extending from a junction between the P-type base and N-type substrate reaches the foregoing P-type region to have the MOSFET turned conductive, the thyristor is thereby clamped between the base and the cathode, and the thyristor is prevented from being mistriggered. With this constitution, the thyristor is turned on only when the voltage across the anode and cathode is lower than the predetermined value so as to have the zero-crossing function achieved, and the prevention of any mistriggering upon occurrence of a high transient state can be attained. However, the thyristor of this Japanese Patent Publication is of the vertical type, and it becomes necessary for providing thereto a reverse-blocking voltage to execute an edge face treatment for the thyristor, and there arises a problem that a packaging has to be restricted by a formation of reverse surface electrode.

An optically triggered lateral thyristor prepared by the planar diffusions for the high current controlling has been disclosed in U.S. Pat. No. 4,779,126 to Thomas Herman, in which a field plate and a guard ring are provided for the thyristor to have a higher breakdown voltage, and a MOSFET which clamps the cathode and P-type base as well as a controlling circuit of the MOSFET therefor are formed within a P-type auxiliary region having a loop section enclosing a P-type base region, so as to have the zero-crossing and mistrigger preventing functions achieved as in the foregoing Japanese Patent Publication. In order to reduce a forward voltage drop in this thyristor, the P-type auxiliary region and the cathode are resistively connected to increase collecting efficiency of the emitter, and impurity doping of anode region is increased. The particular thyristor has a breakdown voltage of 400 to 500V, and this voltage can hardly be made higher. That is, in order to achieve a higher breakdown voltage, it is required to decrease the impurity concentration of the substrate, to extend more the field plate, to make an insulating layer below the field plate thicker, and to increase an interval between the field plate and the guard ring. With this constitution, therefore, there is a problem that the interval between the anode and P-type base regions is increased, so as to increase the forward voltage drop and the chip size.

In any known method for manufacturing the optically triggered lateral thyristor, on the other hand, an insulating layer is first formed on a semiconductor substrate, an opening for diffusion aperture is formed in this insulating layer at a position where an anode region is to he formed, and the anode region is formed by diffusing through the opening into the substrate an impurity material of a conductivity type opposite to the substrate. Next, an opening for diffusion aperture is formed in the insulating layer at a position where a base region is to be formed, and the base region is formed by diffusing through the opening into the impurity material of the conductivity type opposite to the substrate. Next, an opening for diffusion is formed in the insulating layer at a position where a cathode region is to be formed in the base region, and the cathode region is formed by diffusing an impurity material of the same conductivity type as the substrate through the opening. Then, contact windows are formed above the respective anode, base and cathode regions, and anode, base and cathode electrodes are formed with an aluminum thin layer or the like.

In order to reduce the forward voltage drop in this thyristor, it is necessary to reduce the resistance of the base region, and, in order to reduce this resistance, it is required to take measures of increasing the impurity concentration of the base region or another measures of minimizing the base region in its lateral width. At this time, there arises a problem, that, in the event where the former measure is taken, the thyristor is deteriorated in optical sensitivity, while in the event of the latter measure an alignment tolerance between the opening for base diffusion and the opening for cathode diffusing has to be taken into consideration so that the measures have to be subjected to a limitation and a sufficient reduction of the resistance is difficult.

SUMMARY OF THE INVENTION

A primary object of the present invention is, therefore, to provide a method for manufacturing an optically triggered lateral thyristor which is small in the forward voltage drop, high breakdown voltage and high in dV/dt immunity.

This object of the present invention can be realized by a method for manufacturing an optically triggered lateral thyristor wherein an insulating layer is formed on a surface of a semiconductor substrate, a first opening is formed in the insulating layer, an anode region is formed by injecting and diffusing an impurity material of a conductivity type opposite to the substrate through the first opening into the substrate, a base region is formed in the substrate to be spaced from the anode region by injecting and diffusing into the substrate the impurity of the conductivity type opposite to the substrate, a cathode region is formed in surface area of the base region by injecting and diffusing in the surface area an impurity of the same conductivity type as the substrate, and anode, base and cathode electrodes are formed in contact respectively with each of the anode, base and cathode regions, wherein the base and cathode regions are formed in such that second and third openings are formed in the insulating layer at positions spaced from the anode region, diffusion layer and a junction protecting region are formed in the substrate by injecting and diffusing the impurity material of the conductivity type opposite to the substrate through the second and third openings, a fourth opening is formed in the insulating layer at a position between the second and third openings and externally adjacent to the second opening, a base-forming region is formed in the substrate by injecting and diffusing the impurity material of the conductivity type opposite to the substrate through the fourth opening, an injection of the impurity of the same conductivity type as the substrate is made through the fourth opening in the base-forming region, and a double diffusion is made to the base-forming region to form simultaneously the base and cathode regions.

In the optically triggered lateral thyristor according to the foregoing method of the present invention, in particular, the base and cathode regions are formed by means of the double diffusion through the same opening, whereby the lateral width of the base region can be determined by a difference in the length of the diffusions for the base and cathode regions, and this lateral width of the base region can be made effectively smaller since any excessive distance is not required to be retained taking into account an alignment tolerance between the cathode and base regions. It is possible eventually to reduce the resistance of the base region so that the forward voltage drop of the thyristor can be minimized and the current capacity can be increased with any heat generation well restrained.

Other objects and advantages of the present invention shall become clear as following description of a preferred example of the invention advances as detailed with reference to accompanying drawings showing the embodiment.

BRIEF DESCRIPTION OF THE DRAWINGS

FIGS. 1A through 1H are explanatory views for sequences of the method for manufacturing the optically triggered lateral thyristor according to the present invention.

While the present invention shall now be described with reference to the embodiment shown, it should be appreciated that its intention is not to limit the present invention only to such embodiment but rather to include all alterations, modifications and equivalent arrangements possible within the scope of appended claims.

DETAILED DESCRIPTION OF THE PREFERRED EMBODIMENT

Figure 1G:
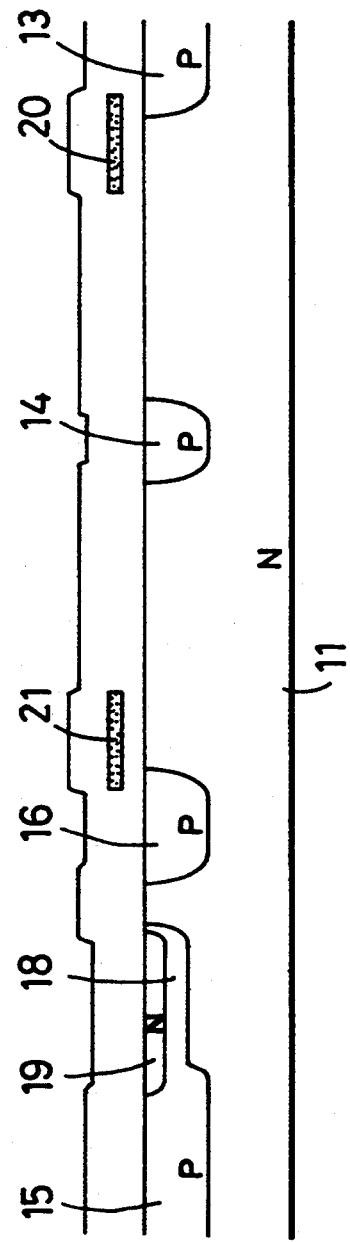

Referring to the method for manufacturing the optically triggered lateral thyristor with reference to FIGS. 1A through 1H, an N-type silicon wafer 11 is first provided with an insulating layer 12 of, for example, $SiO_2$ formed on one surface of the substrate as shown in FIG. 1A, and first openings are formed in this insulating layer 12 as used in the manufacture of ICs photolithography techniques. Then, such P-type impurity as boron is injected and diffused through the first openings into the wafer 11 to form an anode region 13 and a guard ring 14. For the impurity concentration of the N-type silicon wafer, while it should vary depending on a desired breakdown voltage of the lateral thyristor, the impurity concentration will be made to be about $1.4 \times 10^{14}$ cm$^{-3}$ when the breakdown voltage is set to be 700V. When the injection of the P-type impurity is executed by means of an ion implantation, the dose amount is made to be about $5 \times 10^{15}$ cm$^{-2}$.

Next, as shown in FIG. 1B, second and third openings are formed in the insulating layer 12 on the N-type silicon wafer 11 by the etching of photolithography techniques, and a base-contact region 15 and a junction protecting region 16 are formed in the substrate by means of the injection and diffusion of the P-type impurity through the second and third openings, upon which the dose amount of the P-type impurity is made to be about $5 \times 10^{13}$ to $5 \times 10^{14}$ cm$^{-2}$ when its injection is executed by the ion implantation.

While in the steps of FIG. 1A and FIG. 1B have been described as being separately executed, it is possible to omit one of the diffusions executed twice such that, when the P-type impurity material injection is performed by means of the ion implantation, the impurity injection for the base-contact and junction protecting regions 15 and 16 is executed sequentially after the previously executed impurity injection for the anode region 13 and guard ring 14 without performing the diffusion, and thereafter the anode region 13 and guard ring 14 as well as the base-contact and junction protecting regions 15 and 16 are concurrently subjected to the diffusion.

Next, as shown in FIG. 1C, the etching of photolithography techniques is performed with respect to the insulating layer 12 to form fourth opening 17 adjacent to the base-contact region 15, the P-type impurity is injected through the fourth opening 17 and diffused into the substrate and, as shown in FIG. 1D, a base-forming region 18a is formed. In the event where this P-type impurity injection is executed by means of the ion implantation, its dose amount is made to be about $5 \times 10^{13}$ cm$^{-2}$. Next, an N-type impurity is injected through the same fourth opening 17 into surface area of the base-forming region 18a, thereby a double diffusion is executed with respect to the fourth opening 17 made for forming the base-forming region 18a, and a base region 18 and a cathode region 19 are formed concurrently as shown in FIG. 1E. At this time, a lateral diffusion length $x_p$ of the base region 18 as well as a lateral diffusion length $x_n$ of the cathode region 19 are so controlled that a lateral width $W_G(=x_p-x_n)$ of the base region 18 will maintain a distance enough for not causing the forward blocking voltage of the thyristor to be deteriorated, as shown in FIG. 2B.

Next, as shown in FIG. 1F, conducting layers 20 and 21 of, for example, polysilicon layer are formed at proper positions on the insulating layer 12, and thereafter a further insulating layer, of, for example, SiO$_2$ is deposited on the layer 12 by means of, for example, a CVD process as shown in FIG. 1G.

Figure 1H:
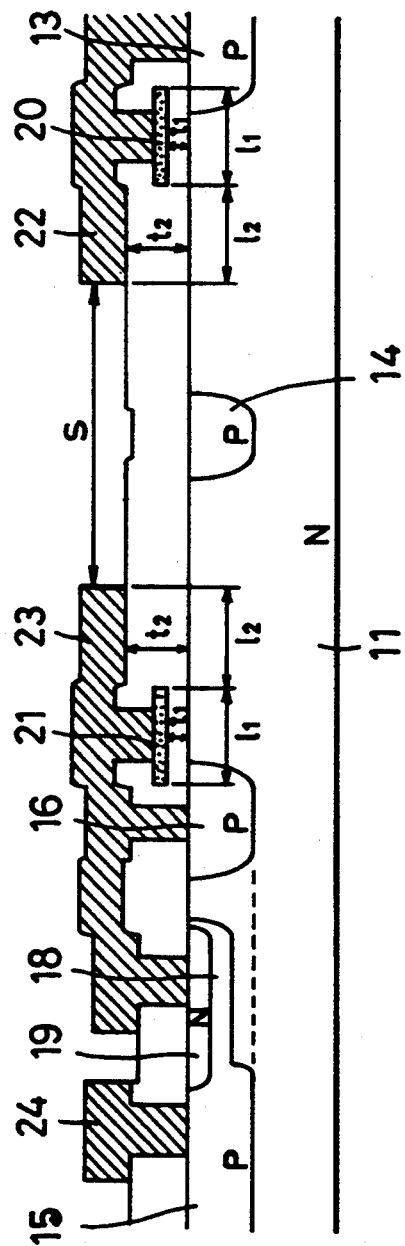

Finally, as shown in FIG. 1H, contact windows are formed through the original and deposited insulating layers at positions above the anode region 13, cathode region 19, base-contact region 15, junction protecting region 16 and conducting layers 20 and 21, thereafter anode, cathode and base electrodes 22, 23 and 24 respectively are formed with such conducting film as an aluminum thin layer in contact with the respective regions 13, 19, 15 and 16 and layers 20 and 21 through the contact windows, and the optically triggered lateral thyristor is thereby completed.

In the above, the conducting layers 20 and 22 mutually contacting are forming a first field plate while the further conducting layers 21 and 23 are forming a second field plate so that, in cooperation with the guard ring 14, electric field concentration in the silicon wafer 11 will be mitigated and a higher breakdown voltage will be attained. In the thyristor thus formed with the silicon wafer of the foregoing impurity concentration, for example, and combined with the first and second field plates separated by a space s of 60 μm and the insulating layer of a thickness $t_1$ below the conducting layers 20 and 21 and generally a thickness $t_2$ respectively of 1 μm and 3 μm, it has been found that such breakdown voltage as high as 700V is attained when the both field plates are made respectively to be of a length $l_1$ or $l_2$ of 15 μm, and as high as 750V when $l_1$ add $l_2$ are 20 μm. That is, the thyristor is optimumly improved in respect of the breakdown voltage by forming the insulating layer stepwise on the silicon wafer.

The foregoing junction protecting region 16 is formed concurrently with the base-contact region 15 as spaced from the base region 18. While this base region 18 is apt to occur electric field concentration because the base region 18 is shallower than the base contact region 15 so as to render the device to become deteriorated in the breakdown voltage, such electric field concentration can be mitigated to prevent the breakdown voltage deterioration from occurring by the junction protecting region 16. That is, required design for the higher breakdown voltage can be realized independently of the diffusion depth of the base region 18 formed by means of the double diffusion for the reduction of the forward voltage drop.

In the above description, as will be readily appreciated, the foregoing conductivity type of the impurities of N and P types may be mutually reversed in practical use.

Figure 2A:
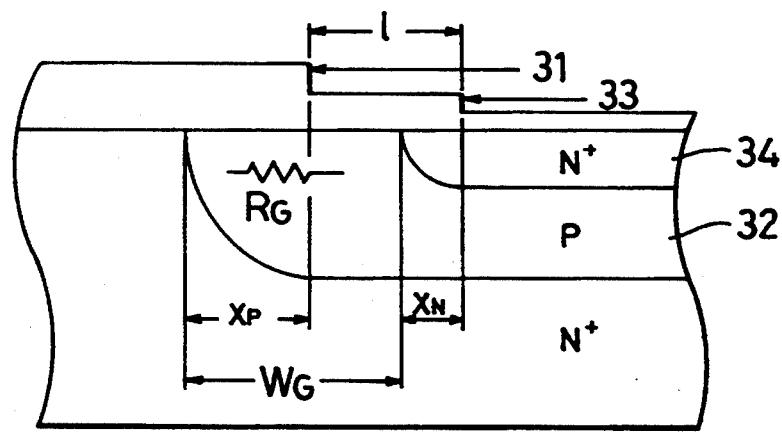
FIGS. 2A and 2B are explanatory views for functions of the optically triggered lateral thyristor manufactured according to the method of FIG. 1.
Figure 2B:
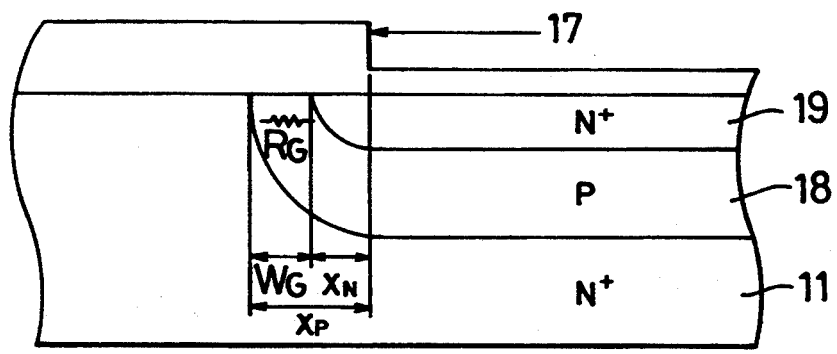

In the optically triggered lateral thyristor according to the manufacturing method of the present invention, the forward voltage drop can be remarkably reduced. That is, in an optically triggered lateral thyristor according to a known manufacturing method, as shown in FIG. 2A, a base region 32 is made to have a lateral width $W_G$ represented by a formula $$W_G = x_p + l - x_n$$

wherein $x_p$ is the lateral diffusion length of the base region 32, $x_n$ is the lateral diffusion length of a cathode region 34, and l is a distance into which the alignment tolerance between an opening 31 for diffusion of the base region and the other opening 33 for diffusion of the cathode region 34. Since, in this known case, the distance l has to be retained, it is difficult to render the lateral width $W_G$ smaller and the resistance value $R_G$ of this base region 32 cannot be reduced. In the optically triggered lateral thyristor according to the present invention, on the other hand, the cathode region 19 is formed in the surface area of the base region 18 through the same opening 17 as that used for forming the base region 18, as seen in FIG. 2B, the lateral width $W_G$ of the base region 18 is made to be $$W_G = x_p - x_n$$

so that, as has been partly described, the lateral width $W_G$ of the base region 18 can be determined by the difference in the lateral diffusion lengths $x_p$ and $x_n$ between the base and cathode regions 18 and 19, so as to be able to be shorter by the distance l than in the case of FIG. 2A. Consequently, the resistance value $R_G$ of the base region 18 can be effectively lowered and the forward voltage drop can be effectively reduced, as will be also readily appreciated.

What is claimed is:

1. A method for manufacturing an optically triggered lateral thyristor having a junction protecting region, guard ring and field plates, said method comprising:
   forming a first insulating layer on a surface of a semiconductor substrate of a first conductivity type;
   forming a first opening through said first insulating layer;
   forming an anode region by injecting and diffusing an impurity material of a second conductivity type opposite to said first conductivity type through said first opening into the substrate;

forming second, third and fourth openings through said first insulating layer at positions respectively spaced from said anode region;

forming a diffusion layer, said junction protecting region and said guard ring by injecting and diffusing an impurity of said second conductivity type through said second, third and fourth openings into the substrate;

forming a fifth opening through said first insulating layer at a position between said second and third openings and externally adjacent to said second opening;

forming a second conductivity type region by injecting and diffusing an impurity of said second conductivity type through said fifth opening into the substrate;

injecting an impurity of said first conductivity type through said fifth opening into said second conductivity type region;

performing a double diffusion step wherein base and cathode diffusions are performed through said fifth opening, in the absence of an intervening masking step, for transforming said second conductivity type region made through said fifth opening into a base region and transforming said first conductivity type impurity injected through said fifth opening into a cathode region, said base and cathode regions being transformed with a difference in their diffusion length which realizing stably the minimum lateral width of the base region for reducing the forward voltage drop of the thyristor;

forming on said first insulating layer conducting layers at positions cooperable with said guard ring;

forming a second insulating layer over said first insulating layer and conducting layers; and forming on said second insulating layer anode, base and cathode electrodes in contact respectively with said anode, base and cathode regions through said first and second insulating layers, said anode and cathode electrodes respectively being in contact also with respective conducting layers to form said field plates.

* * * * *